(12) United States Patent
Hötz Ordoño et al.

(10) Patent No.: US 9,664,722 B2
(45) Date of Patent: May 30, 2017

(54) SYSTEM FOR PERFORMING ELECTRICAL TESTS TO ELECTRICAL WIRING HARNESSES

(71) Applicant: EADS Contrucciones Aeronauticas S.A., Getafe (ES)

(72) Inventors: Josef Ignacio Hötz Ordoño, Getafe (ES); Alfonso Marcial Herrera, Getafe (ES); César Álvarez Arroyo, Getafe (ES); Elisa Jiménez Luengo, Getafe (ES)

(73) Assignee: EADS Construcciones Aeronauticas, S.A., Getafe (ES)

( * ) Notice: Subject to any disclaimer, the term of this patent is extended or adjusted under 35 U.S.C. 154(b) by 141 days.

(21) Appl. No.: 14/630,207

(22) Filed: Feb. 24, 2015

(65) Prior Publication Data

US 2015/0241473 A1    Aug. 27, 2015

(30) Foreign Application Priority Data

Feb. 24, 2014  (EP) .................................... 14382061

(51) Int. Cl.
| G01R 31/02 | (2006.01) |
| B60R 16/02 | (2006.01) |
| G01R 31/04 | (2006.01) |
| H01R 43/28 | (2006.01) |

(52) U.S. Cl.
CPC ........ G01R 31/021 (2013.01); B60R 16/0207 (2013.01); G01R 31/045 (2013.01); H01R 43/28 (2013.01)

(58) Field of Classification Search
USPC ................................................ 324/503, 537
See application file for complete search history.

(56) References Cited

U.S. PATENT DOCUMENTS

| 5,072,185 A |   | 12/1991 | Rockwell |
| 6,077,108 A | * | 6/2000 | Lorscheider ........... B65H 75/44 439/4 |
| 6,272,387 B1 |   | 8/2001 | Yoon |
| 6,625,299 B1 |   | 9/2003 | Meisner et al. |

(Continued)

FOREIGN PATENT DOCUMENTS

EP    2575147    4/2013

OTHER PUBLICATIONS

European Search Report, Jul. 22, 2014.

*Primary Examiner* — Minh Phan
(74) *Attorney, Agent, or Firm* — Greer, Burns & Crain Ltd.

(57) ABSTRACT

A system to perform tests quickly and accurately to wiring harnesses. The system comprises a workstation equipped with an electrical test machine with test terminals disposed on the end of extendable hoses, a connection interface between harness connectors and terminals tests, a working board to perform on it the tests to a wiring harness, one or more projection devices arranged to project images onto the working board and a computer system to supply such projection devices with images to assist the operators performing the tests. The connection interface is formed by adapter modules connectable by one side to the wiring harness connectors and by the other to the test terminals. Test terminals and adapter modules comprise electronic circuits and external identification labels holding identification information.

7 Claims, 3 Drawing Sheets

(56) References Cited

U.S. PATENT DOCUMENTS

| | | |
|---|---|---|
| 7,112,969 B1 | 9/2006 | Thomas |
| 8,442,664 B1 | 5/2013 | Guglielmo et al. |
| 2003/0144817 A1 | 7/2003 | Smith et al. |
| 2010/0010758 A1 | 1/2010 | Kinahan |
| 2013/0100277 A1 | 4/2013 | Prieto Loefkrantz et al. |
| 2014/0002101 A1 | 1/2014 | Lussier |

* cited by examiner

SYSTEM FOR PERFORMING ELECTRICAL TESTS TO ELECTRICAL WIRING HARNESSES

CROSS-REFERENCES TO RELATED APPLICATIONS

This application claims the benefit of the European patent application No. 14382061.1 filed on Feb. 24, 2014, the entire disclosures of which are incorporated herein by way of reference.

FIELD OF THE INVENTION

The present invention relates to a system for performing electrical tests to electrical wiring harnesses of any size, number of components and spatial distribution, such as those designed for the aeronautical industry, the naval industry or the automotive industry.

BACKGROUND OF THE INVENTION

An electrical wiring harness is formed by a bundle of wires of different types arranged in a particular order which are bound together in order to facilitate the installation, repair and maintenance of the wires and the connection of a plurality of equipment pieces distant from each other.

The electrical wiring harnesses used, in particular, in the aeronautic industry are quite complex by the number of wires and connectors that they have. They are manufactured in workbenches such as those described in U.S. Pat. No. 6,272,387, U.S. Pat. No. 6,625,299, U.S. Pat. No. 7,507,113 and EP 2 575 147 A2 that include computer systems that provide information to assist the workers involved in the manufacturing process.

After being manufactured an electrical wiring harness must be subject to continuity and insulation electrical tests to ensure it meets the electrical specifications required and that has been correctly assembled.

One of the problems raised by said tests is the connection of the connectors of the electrical wiring harnesses to the test machines because the general purpose of the wire testing machines, on the one hand, and the specific typology of the connectors of the wiring harnesses of each particular industry, on the other hand, shall be combined.

To solve this problem, interfaces for connecting wiring harnesses to electrical test machines such as those described in U.S. Pat. No. 5,072,185 and U.S. Pat. No. 7,112,969 have been proposed. However, for complex electrical wiring harnesses as those used in the aircraft industry, the connection operation to the test machine is laborious and prone to making mistakes even using interface elements such as the abovementioned.

SUMMARY OF THE INVENTION

An object of the present invention is to provide a system to perform electrical tests quickly and accurately to any electrical wiring harness regardless of the position, number and type of components that conform it.

This object is achieved by a system comprising a workstation equipped with an electrical test machine provided with test terminals disposed on the end of extendable hoses, a connection interface between harness connectors and terminals tests, a working board to perform on it the electrical tests to a harness, one or more projection devices arranged to project images onto the working board and a computer system to supply such projection devices with images to assist the operators performing the tests. Said connection interface is formed by adapter modules connectable by one face to the wiring harness connectors and by other face to the test terminals. Test terminals and adapter modules comprise electronic circuits and external identification labels holding identification information of them.

This system simplifies and facilitates the preparation and execution of the test of any electrical wiring harness regardless of its size, number and distribution of components. The ability to approach the test points of the machine to the space point where the harness component is located, as well as the possibility of increasing the number and type of adapter modules, depending on the existing needs, allows configuring the system for performing the test of any typology of electrical wiring harness.

Moreover, the system assists the end-user in the preparation and execution operations of the electrical test, guiding step-by-step the connection of the wiring harness to the test machine, indicating visually to the operator the position of the harness connector and the mobile test terminal and showing additionally the identification code of the adapter module associated with each component of the harness in each preparation task and allow checking the correct connection of the equipment processing the identification codes housed in said electronic circuits, Advantageously, the system also includes cameras to take images of the operations in the working board that can allow the identification of, in particular, the adapter modules placed on the working board processing the identifier codes contained in their external labels.

In one embodiment of the invention, the test terminals comprise connectors with a predetermined number of connection points and the connection interface between harness connectors and test terminals comprise different adapter modules for each type of harness connector having the corresponding counter-connector disposed on one face and on the opposite face, a connector with the same number and configuration of connection points as the connectors of the test terminals. This structuring of the test terminals and adapter modules contributes positively to simplifying the tasks of preparation and execution of tests.

Other desirable features and advantages of this invention will become apparent from the subsequent detailed description of the invention and the appended claims, in relation with the enclosed drawings.

DETAILED DESCRIPTION OF THE PREFERRED EMBODIMENTS

Figure 1:
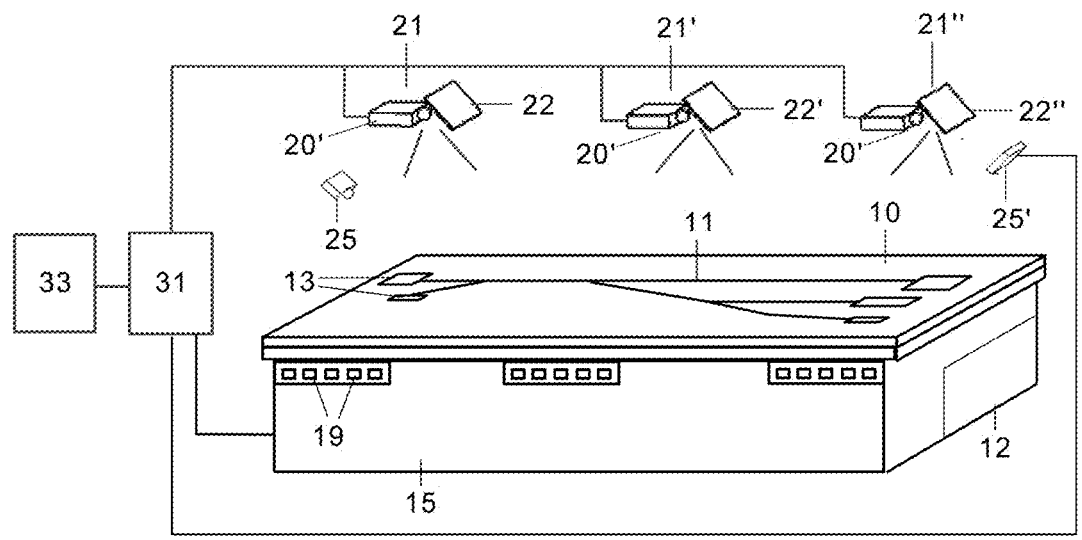
FIG. 1 is a schematic representation of an electrical wiring harness disposed on a working board to perform electrical tests illustrating some of the components of the system of the invention.

The main components of the system for testing electrical wiring harnesses according to the invention are:

A workstation 15 including an electrical testing machine 12 with a plurality of mobile test terminals 19 for approaching the machine points to the use points and a working board 10. The test terminals 19 are attached to extendable hoses 17 actuated by means of devices 35 based on pulleys 37 integrated in the workstation 15 to enable their movement away from it to perform the tests and their retreat once the tests have been ended. The electrical testing machine 12 generates electrical stimuli (voltage and current) and receives responses so that resistance values can be measured to perform continuity and insulation tests. Testing machine 12 has stimulation and acquisition cards capable of holding thousands of possible test points.

Adapter modules 41 as interface elements between the connectors 13 of the electrical wiring harnesses 11 and the tests terminals 19. For each type of connector 13 of an electrical wiring harness, an adapter module 41 with one face configured as its corresponding counter-connector 77 is available. The electrical wiring harness 11 subject to testing is fixed on the working board 10. To perform the electrical tests each connector 13 of the electrical wiring harness 11 must be connected to an adapter module 41 and the later to a test terminal 19 on the working board 10.

Several projecting devices 21, 21', 21" to project on the working board 10 images that display information concerning the electrical test operations and particularly the connecting operation of the electrical wiring harness 11 to the electrical testing machine 12 and to the checking operation to asses that the connection has been properly made. In the embodiment shown in FIG. 1 the devices 21, 21', 21" are formed by projectors 20, 20', 20" placed in a horizontal plane parallel to the working board 10 and mirrors 22, 22', 22" transforming the horizontal projection on a vertical projection on the working board 10. In other embodiments where a horizontal working board 10 is not used the projecting devices 21, 21', 21" are arranged so that the images are projected vertically on the working board 10 The projecting devices 21, 21', 21" are arranged as a unitary assembly such that each of them projects a part of the full image projected onto the working board 10. Their number depends, among other factors, the size of the working board 10.

Optionally several cameras 25, 25' to capture images of the operations performed on the working board 10.

A computer system 31 comprising a computer, connected to the abovementioned devices and components and to a documentation repository 33 containing information about the electrical wiring harness 11 and the operations to be performed during the electrical tests, and software adapted to generate images with support information on such operations so that the operator can perform them quickly and accurately.

Test terminals 19 and adapter modules 41 include cards with electronic circuits that are connected via a bus to a communication card installed in the computer of the computer system 31, which may be located next to the electrical testing machine 12. The software of the computer system 31 is also adapted to record in memory units of said electronic circuits identification codes of test terminals 19 and adapter modules 41. Optionally, the software can also be adapted to identify the adapter modules 41 located on the working board 10 by processing their external identification codes, which can be, for example, bi-dimensional barcodes included in their identification labels taken from images captured by said cameras 25, 25'.

Figure 2A:
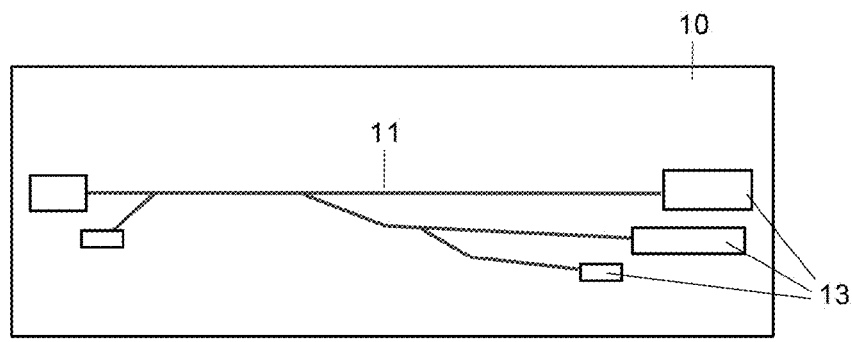
FIG. 2a is a schematic plan view of a wiring harness disposed on a working board and FIG. 2b is a schematic image illustrating the support information projected on said board, overlapped over the wiring harness, to facilitate the realization of the operations necessary to perform said electrical tests.
Figure 2B:
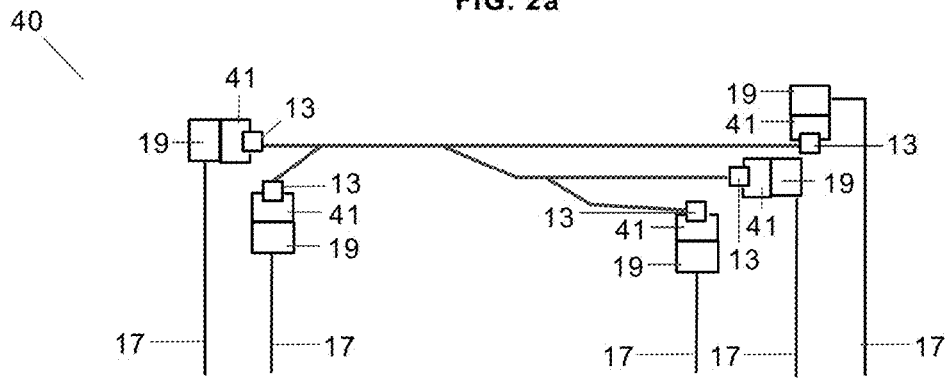

FIG. 2*b* shows schematically an example of an image 40 that would be projected by the projecting devices 21, 21', 21" on the working board 10 and which would overlap the electrical wiring harness 11 shown in FIG. 2*a*. In the image 40 the adapter modules 41 and test terminals 19 arranged at the end of extensible hoses 17 that shall be used for each connector 13 of the electrical wiring harness 11 are shown. The representations of all elements included in the image 40 would include their identification although, for simplicity, are not shown in FIG. 2*b*. With this information, the operator can perform the connection operation of the electrical wiring harness 11 to the electrical testing machine 12 quickly and accurately. The generation of images such as the image 40 may be done adapting known software.

The computer system 31 may also provide sequentially images with, only, the relevant information for each step of the connecting process of the electrical wiring harness 11 to the electrical testing machine 12.

The computer system 31 can also provide images identifying elements in which a connecting error has been detected during a test performed with said purpose. For its generation the computer system 31 not only processes information contained in the documentation repository 33 but also information received from the electrical testing machine 12 by means of the identification system formed by the electronic circuitry incorporated in the test terminals 19 and the adapter modules 41.

Figure 3A:
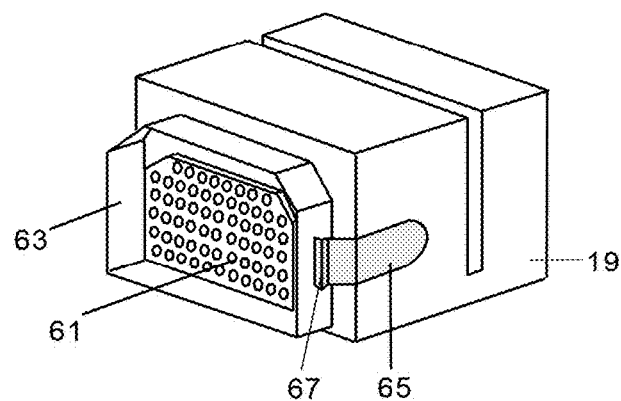
FIGS. 3a and 3b are perspective views of a test terminal of the test machine showing, respectively, its front and rear faces.
Figure 4:
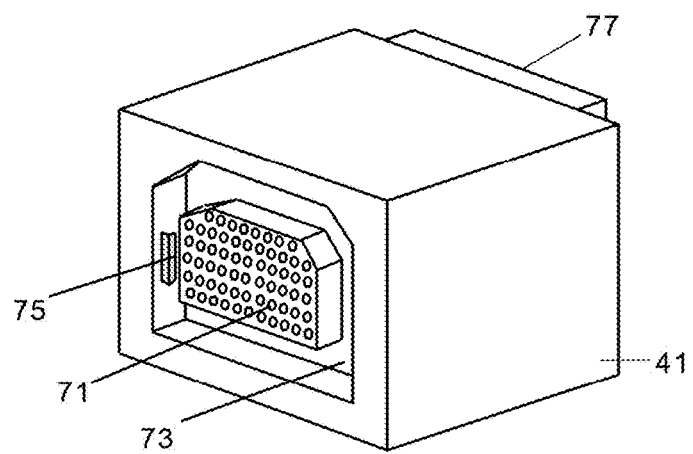
FIG. 4 is a perspective view of an adapter module that is used as an interface between the connectors of the electrical wiring harnesses and the test terminals.

In the embodiment illustrated in FIGS. 3*a* and 4, the respective connection faces between the adapter modules 41 and the test terminals 19 are configured to facilitate coupling. The main features of this configuration are the following:

The connectors 61, 71 of, respectively, the test terminals 19 and the adapter modules 41 have the same number of connection points, for example 70. They are, preferably, quick coupling connectors of retractable pins.

The connectors 71 of the adapter modules 41 are arranged in a recessed space 73 so that the connectors 61 of the test terminals 19 can be housed in it. Their coupling is facilitated by the frames 63 of the test terminals 19 which are arranged to fit into said recess space 73.

The test terminals 19 include an element 67 of a flange device to be locked when connected to the adapter modules 41 cooperating with a spring 75 disposed therein. The test terminals 19 include a button 65 that allows unlocking the flange device.

Figure 3B:
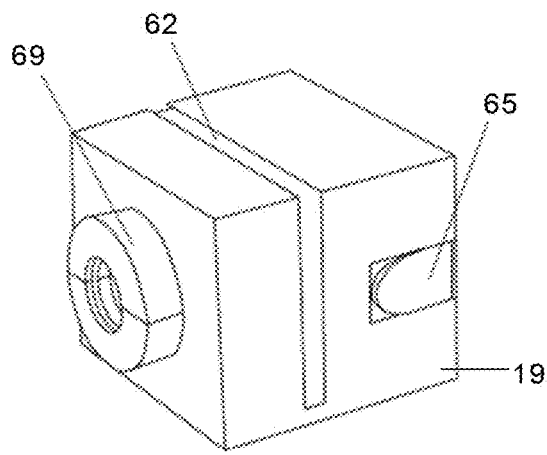
Figure 5:
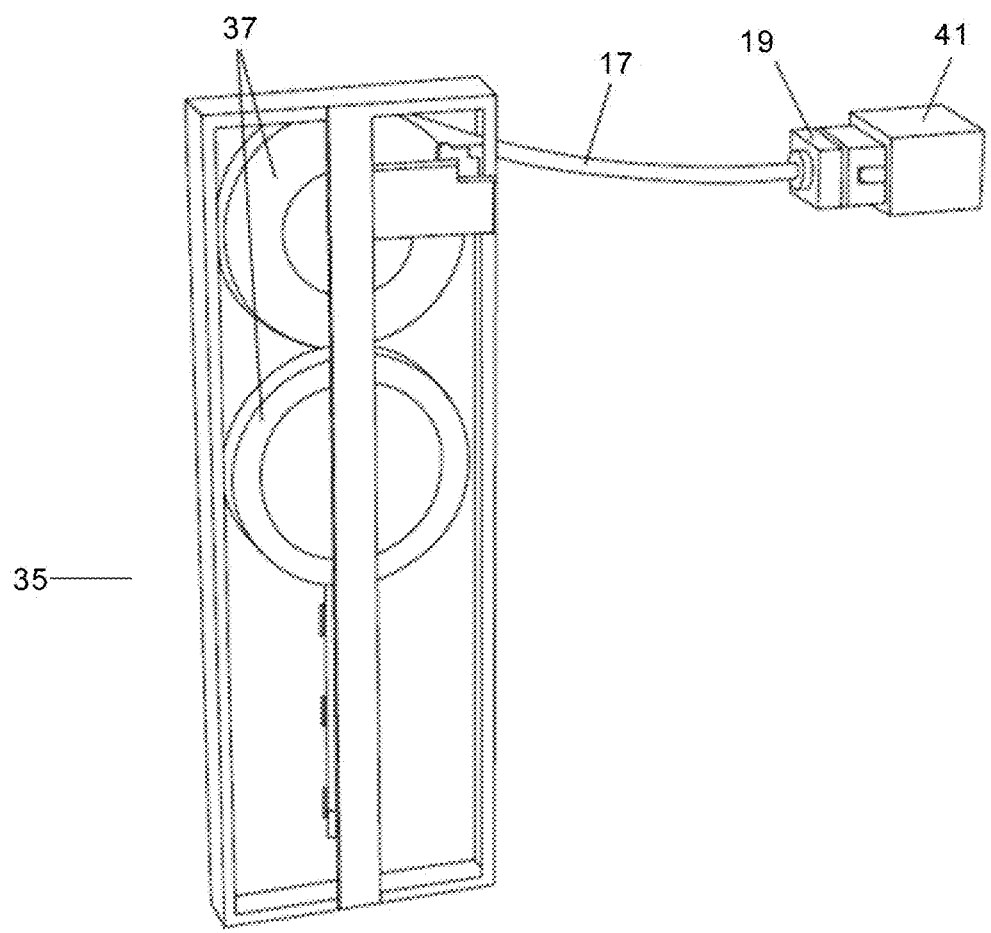
FIG. 5 is a perspective view of an extension-collecting device of a hose having mounted in its end a test terminal with an adapter module coupled thereto.

Moreover, in the embodiment illustrated in FIGS. 3*b* and 5, the test terminals 19 have in the rear face a strain relief device 69 of extensible hoses 17 entering into them formed by two pieces that are screwed one on top of the other as a clamp.

The test terminals 19 may be configured with a lighting device therein, such as, for example, a LED arranged so that its light can propagate through a slot 62 suitably shaped as a waveguide (see FIG. 3*b*).

Among the advantages of the present invention the following can be mentioned:

Testing of electrical wiring harnesses 11 can be performed with support information provided sequentially for the various steps involved in their execution.

Ease to connect without error the adapter modules 41 to the connectors 13 of the electrical wiring harnesses 11 and the test terminals 19 to the adapter modules 41.

Radical decrease of the time required to perform the connection operations.

Absence of errors thanks to the built-in identification system included in test terminals 19 and adapter modules 41.

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

The invention claimed is:

1. A system for performing electrical tests to an electrical wiring harness comprising:
    a workstation with an electrical testing machine provided with test terminals and
    a connection interface between harness connectors and test terminals,
    the test terminals being arranged at the end of extendable hoses from the electrical testing machine so that the test terminals can move away from the electrical testing machine;
    the connection interface being formed by adapter modules connectable by one face to the wiring harness connectors and by another face to the test terminals;
    the test terminals and the adapter modules comprising electronic circuits with at least memory units to hold identification information of the test terminals and the adapter modules;
    the workstation also comprising a working board to perform on the workstation, firstly, the connection of the adapter modules to the wiring harness connectors and to the test terminals and, secondly, a testing of the electrical wiring harness and one or more projecting devices arranged to project images onto the working board; and
    a computer system including a computer connected to said projecting devices, to components for testing an electrical wiring harness and to a documentation repository concerning the electrical wiring harness subject of a test, and a software adapted to supply to said projecting devices images concerning the test of the electrical wiring harness allowing operators to perform the test using only the support information provided by said images.

2. The system of claim 1 further comprising one or more cameras arranged to capture images of the operations performed on the working board and connected to the computer of the computer system and wherein said software is adapted for processing external identification labels of the adapter modules contained in the images captured by said cameras to identify the adapter modules.

3. The system according to claim 1, wherein:
    the test terminals comprise connectors with a predetermined number of connection points; and
    the connection interface between harness connectors and the test terminals comprises different adapter modules for each type of harness connector with the corresponding counter-connector arranged in one face and with a connector with the same number and the same configuration of connection points of the connectors of test terminals on an opposite face.

4. The system according to claim 3, wherein:
    the connectors of the test terminals are arranged protruding from the connection face with the adapter modules;
    the connectors of the adapter modules are disposed in a recessed space of the connecting face with the test terminals;
    the test terminals comprise a frame protruding from the connection face with the adapter modules arranged to fit on an inner edge of said recessed space of the adapter modules facilitating the coupling of the connectors of the test terminals with the connectors of the adapter modules;
    the test terminals and the adapter modules comprising cooperating elements of a flange device that allows locking the test terminals and the adapter modules when they are coupled and the test terminals also comprise an actuator of said flange device for unlocking the test terminals from the adapter modules.

5. The system according to any of claim 1, wherein the test terminals comprise at least one lighting device arranged inside a slot configured as a waveguide for the light emitted by said device.

6. The system according to claim 1, wherein the test terminals comprise on their connecting face with the extendable hoses a strain relief device of the extendable hoses.

7. The system according to claim 1, wherein the workstation includes devices with pulleys to extend and retract said extendable hoses.

* * * * *